United States Patent
Yamanaka et al.

(10) Patent No.: US 9,318,984 B2
(45) Date of Patent: Apr. 19, 2016

(54) LINEAR MOTOR DEVICE AND METHOD FOR CONTROLLING LINEAR MOTOR DEVICE

(71) Applicant: THK CO., LTD., Tokyo (JP)

(72) Inventors: Shuhei Yamanaka, Tokyo (JP); Yuki Nomura, Tokyo (JP)

(73) Assignee: THK CO., LTD., Tokyo (JP)

( * ) Notice: Subject to any disclaimer, the term of this patent is extended or adjusted under 35 U.S.C. 154(b) by 0 days.

(21) Appl. No.: 14/362,849

(22) PCT Filed: Dec. 5, 2012

(86) PCT No.: PCT/JP2012/081499
§ 371 (c)(1),
(2) Date: Jun. 4, 2014

(87) PCT Pub. No.: WO2013/084933
PCT Pub. Date: Jun. 13, 2013

(65) Prior Publication Data
US 2014/0333236 A1 Nov. 13, 2014

(30) Foreign Application Priority Data

Dec. 7, 2011 (JP) .................................. 2011-267938
Nov. 9, 2012 (JP) .................................. 2012-247400

(51) Int. Cl.
*H02P 6/00* (2006.01)
*H02P 25/06* (2006.01)
(Continued)

(52) U.S. Cl.
CPC .............. *H02P 6/006* (2013.01); *H02K 41/031* (2013.01); *H02P 25/06* (2013.01); *H05K 13/0413* (2013.01)

(58) Field of Classification Search
CPC ........................................................ H02P 6/006
USPC ............................................. 318/135, 34, 255
See application file for complete search history.

(56) References Cited

U.S. PATENT DOCUMENTS 5,064,353 A * 11/1991 Tsukahara .................... 417/383
5,371,450 A * 12/1994 Hiraoka ....................... 318/560
(Continued)

FOREIGN PATENT DOCUMENTS

CN 103765741 A 4/2014
EP 1 892 083 A2 2/2008
(Continued)

OTHER PUBLICATIONS

International Search Report dated Feb. 19, 2013 issued in corresponding application No. PCT/JP2012/081499.
(Continued)

*Primary Examiner* — David S Luo
(74) *Attorney, Agent, or Firm* — Westerman, Hattori, Daniels & Adrian, LLP

(57) ABSTRACT

A linear motor device includes a linear motor and a control unit configured to apply a load to a pressurizing object by causing a movable part of the linear motor to move. After causing the movable part to move toward the pressurizing object at a predetermined first speed based on position control, the control unit controls the movable part to move by performing deceleration to a second speed which is slower than the first speed and at which the pressure applied to the pressurizing object is less than or equal to a predetermined pressure when the movable part starts to apply the pressure to the pressurizing object, and the control unit causes the movable part to move until the current flowing through the linear motor is greater than or equal to a predetermined current limit value.

9 Claims, 16 Drawing Sheets

(51) Int. Cl.
　　*H02K 41/03*　　(2006.01)
　　*H05K 13/04*　　(2006.01)

(56) References Cited

U.S. PATENT DOCUMENTS

| | | | |
|---|---|---|---|
| 7,049,775 B2 * | 5/2006 | Iwashita | B30B 15/0094 318/566 |
| 7,918,120 B2 * | 4/2011 | Suzuki | 72/453.13 |

FOREIGN PATENT DOCUMENTS

| | | |
|---|---|---|
| JP | 61-76087 A | 4/1986 |
| JP | 6-202737 A | 7/1994 |
| JP | 10-261897 A | 9/1998 |
| JP | 11-110048 A | 4/1999 |
| JP | 2001-210995 A | 8/2001 |
| JP | 2004-79890 A | 3/2004 |
| JP | 2007-181379 A | 7/2007 |
| JP | 2009-33949 A | 2/2009 |
| JP | 2009-194015 A | 8/2009 |
| TW | 200827156 A | 7/2008 |

OTHER PUBLICATIONS

Kohden Co., Ltd., "Vertical-Type MR Sensor Technical Data" [online], Oct. 1, 2005, retrieval on Nov. 7, 2011, internet<URL;http://www.hkd.co.jp/technique/img/amr-note1.pdf>.

Office Action dated Nov. 16, 2015, issued in counterpart Chinese Patent Application No. 201280059857.X, with English translation. (21 pages).

Office Action dated Jan. 14, 2016, issued in counterpart Taiwanese Patent Application No. 101145731 with Partial English translation. (5 pages).

* cited by examiner

| POSITION | MAGNETIC VECTOR |
|---|---|
| A | ↑ |
| B | → |
| C | ↓ |
| D | ← |
| E | ↑ |

LINEAR MOTOR DEVICE AND METHOD FOR CONTROLLING LINEAR MOTOR DEVICE

TECHNICAL FIELD

The present invention relates to a linear motor device and a method for controlling the linear motor device.

Priority is claimed on Japanese Patent Application No. 2011-267938, filed Dec. 7, 2011 and Japanese Patent Application No. 2012-247400, filed Nov. 9, 2012, the content of which is incorporated herein by reference.

BACKGROUND ART

When a workpiece such as an electronic part is mounted on a substrate, a machining device used to pass the workpiece against the substrate is used. In this machining device, a linear motor or the like is used as means used to pass the workpiece (Patent Literature 1).

In this machining device, it is necessary to press the workpiece at a fixed load (pressure) or more so as to securely mount the workpiece on the substrate. At this time, in order to prevent damage of the workpiece or the substrate, it is necessary for the load to be as light as possible. In the machining device, it is necessary to control the workpiece load with high accuracy.

CITATION LIST

Patent Literature

[Patent Literature 1]
Japanese Unexamined Patent Application, First Publication No. 2009-194015

SUMMARY OF INVENTION

Technical Problem

In technology disclosed in Patent Literature 1, a linear motor is controlled based on information obtained from the load detector using a load detector used to measure the workpiece load. Thus, when a mounting position of the load detector is shifted or when there is a large error in detection accuracy of the load detector, there is a problem in that the accuracy of the control of the workpiece load is degraded.

An objective of the present invention is to provide a linear motor device and a method for controlling the linear motor device that enable the accuracy of pressing control of an pressurizing object to be improved without using a sensor used to measure a load for the pressurizing object such as a workpiece.

Solution to Problem

An aspect of a linear motor device of the present invention is a linear motor device including a linear motor and a control unit configured to apply a pressure to a pressurizing object by causing a movable part of the linear motor to move, wherein, after causing the movable part to move toward the pressurizing object at a predetermined first speed based on position control, the control unit controls the movable part to move by performing deceleration to a second speed which is slower than the first speed and at which the pressure applied to the pressurizing object is less than or equal to a predetermined pressure when the movable part starts to apply the pressure to the pressurizing object, and the control unit causes the movable part to move at the second speed until a current flowing through the linear motor is greater than or equal to a predetermined current limit value.

An aspect of a method for controlling a linear motor device of the present invention is a method for controlling a linear motor device including a linear motor and a control unit configured to apply a pressure to a pressurizing object by causing a movable part of the linear motor to move, the method of controlling includes after causing the movable part to move toward the pressurizing object at a predetermined first speed based on position control, controlling the movable part to move by performing deceleration to a second speed which is slower than the first speed and at which the pressure applied to the pressurizing object is less than or equal to a predetermined pressure when the movable part starts to apply the pressure to the pressurizing object; and causing the movable part to move at the second speed until a current flowing through the linear motor is greater than or equal to a predetermined current limit value.

Advantageous Effects of Invention

According to the present invention, a linear motor device performs deceleration to a second speed which is slower than a first speed before a movable part comes in contact with an object (workpiece) to be pressed, thereby pressing the movable part against the pressurizing object without imposing unnecessary impact on the pressurizing object. Therefore, it is possible to improve the accuracy of pressing control of the pressurizing object.

DESCRIPTION OF EMBODIMENTS

Hereinafter, a linear motor device and a method for controlling in an embodiment of the present invention will be described with reference to the drawings.

Figure 1:
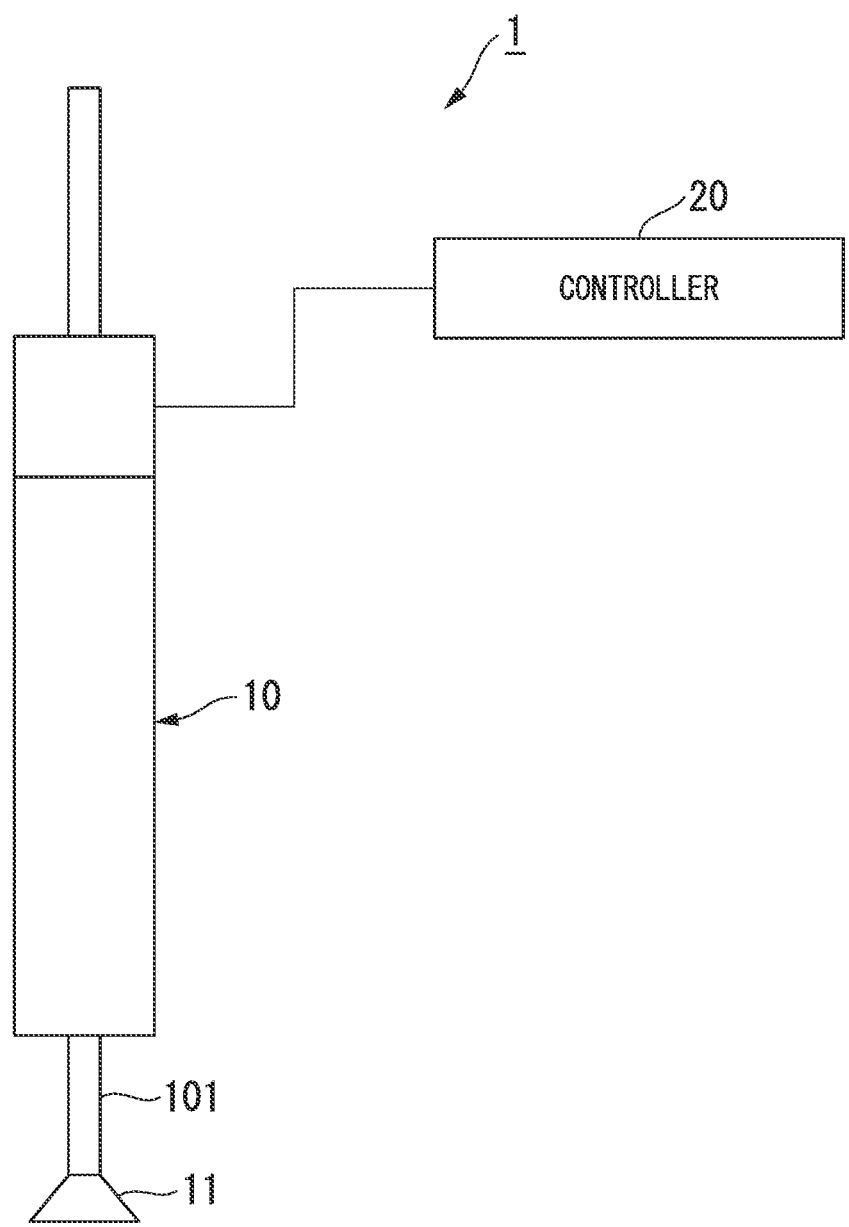
FIG. 1 is a schematic block diagram showing a configuration of a machining device 1 in an embodiment of the present invention.

FIG. 1 is a schematic block diagram showing a configuration of a machining device 1 in the embodiment of the present invention.

The machining device 1, which is a motor device, includes a rod type linear motor 10, a pressing body 11 mounted on the linear motor 10, and a control unit 20 configured to control the linear motor 10. The pressing body 11 is mounted on a tip of a rod 101 of the linear motor 10.

The machining device 1 causes the pressing body 11 to move in a vertical direction and causes the pressing body 11 to abut a workpiece 33 (a pressurizing object) such as an electronic part. Then, the workpiece 33 is pressed toward the substrate 31 using the pressing body 11. Thereby, the machining device 1 mounts the workpiece 33 on a predetermined position of the substrate 31 via an adhesive 32. Hereinafter, configurations of the linear motor 10 and the control unit 20 will be described.

Figure 2:
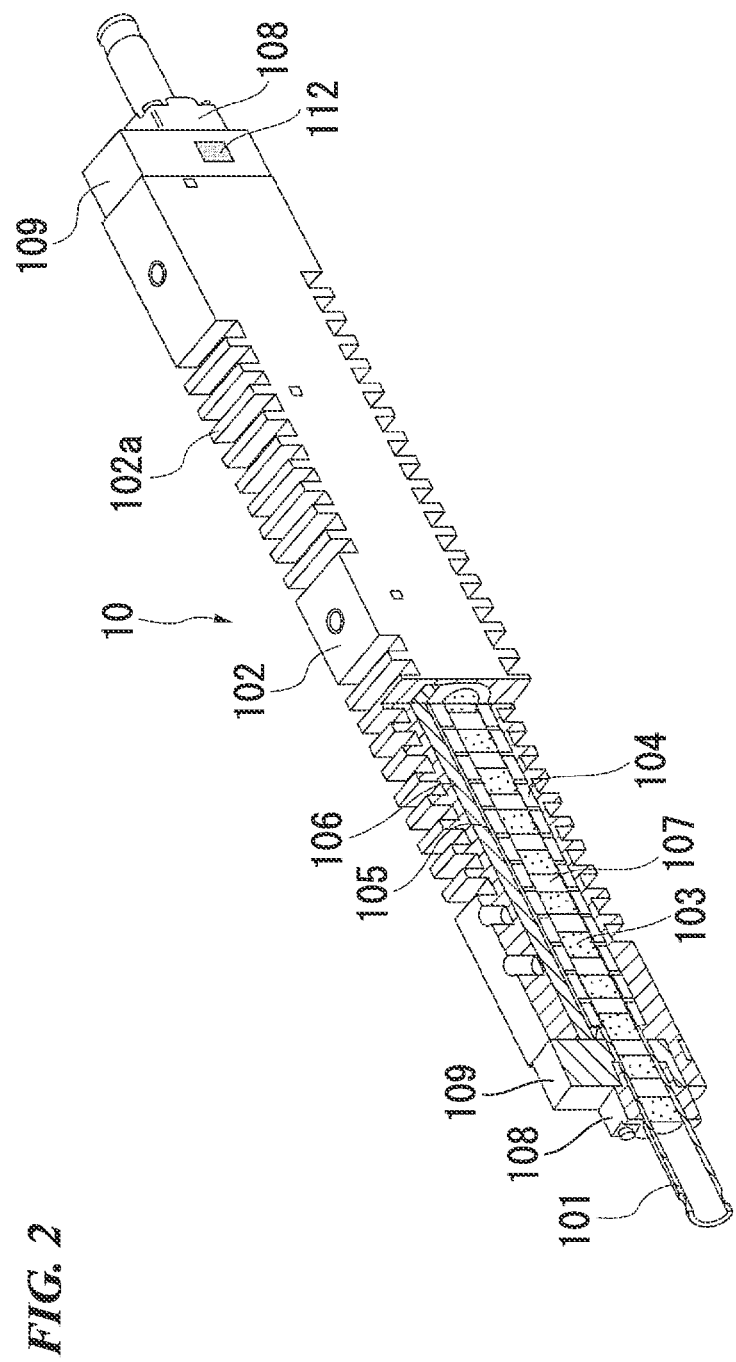
FIG. 2 is a perspective view (partial cross-sectional view) of a linear motor 10 in the embodiment of the present invention.

FIG. 2 is a perspective view (partial cross-sectional view) of the linear motor 10 in the embodiment of the present invention.

The linear motor 10 can move the rod 101 in an axial direction with respect to a coil housing case 102. Within the coil housing case 102, a plurality of coils 104 held in a coil holder 105 are layered (arranged). The end case 109 is mounted on each of both end surfaces of the coil housing case 102. The bush 108, which is a bearing used to guide linear motion of the rod 101, is mounted on the end case 109.

The rod 101, for example, is formed of a non-magnetic material such as stainless steel and has a hollow space like a pipe. In the hollow space of the rod 101, a plurality of magnets 103 (segment magnets) each having a cylindrical shape are layered in a longitudinal direction of the rod 101 such that the same poles thereof face each other. Each magnet 103 has an N pole facing that of one adjacent magnet 103 and an S pole facing that of the other adjacent magnet 103. For example, pole shoes 107 (magnetic pole blocks) formed of a magnetic material such as iron are interposed between the magnets 103. The rod 101 penetrates the inside of the layered coils 104, and is supported by the coil housing case 102 so as to be movable in the axial direction.

Figure 3:
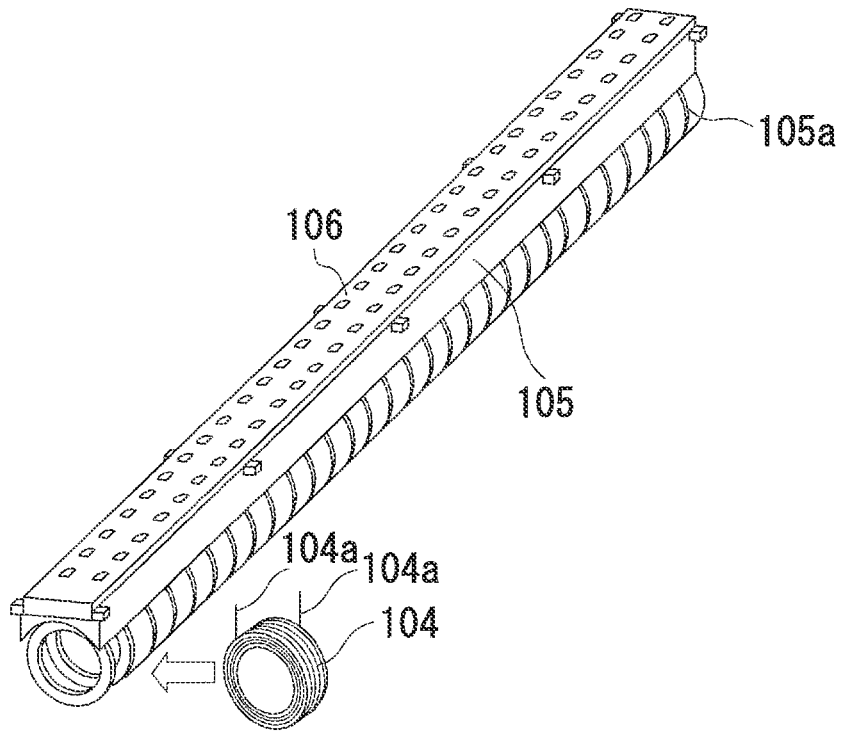
FIG. 3 is a perspective view showing a coil unit held in a coil holder 105 in this embodiment.

FIG. 3 is a perspective view showing a coil unit held in the coil holder 105 in this embodiment.

As shown in FIG. 3, each coil 104 is a spiral winding of a copper wire, and is held by the coil holder 105. The plurality of coils 104 are windings of copper wires wound around an outer circumference of the rod 101 centering on an array direction of the magnets 103 of the rod 101. The respective coils 104 are arranged in the same direction as the array direction of the magnets 103.

Because it is necessary to insulate the adjacent coils 104, ring-shaped spacers 105a formed of a resin are interposed between the coils 104. A printed-circuit board 106 is provided on the coil holder 105. End portions 104a of the winding wire of the coil 104 are connected to the printed-circuit board 106 through wires.

In this embodiment, the coil housing case 102 is molded integrally with the coils 104 through the insert molding. Specifically, the coil housing case 102 is molded by setting the coils 104 and the coil holder 105 in a mold and by injecting a melted resin or special ceramics thereinto.

As shown in FIG. 2, a plurality of fins 102a are formed on the coil housing case 102 in order to increase the heat radiation performance of the coils 104. The coils 104, which are held by the coil holder 105, may be housed in the coil housing case 102 formed of aluminum, and the gap between the coils 104 and the coil housing case 102 may be filled with an adhesive. Thereby, the coils 104 and coil holder 105 may be fixed to the coil housing case 102.

Figure 4:
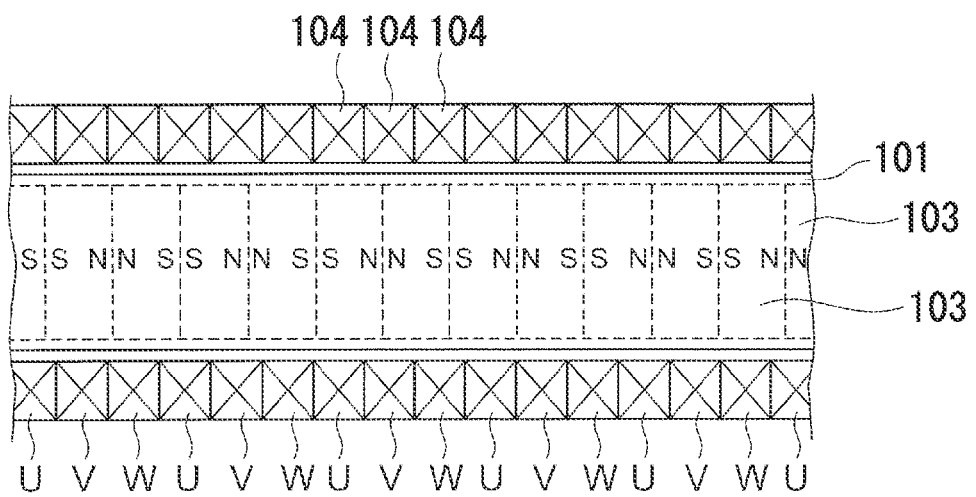
FIG. 4 is a diagram showing a positional relationship between magnets 103 and coils 104 of the linear motor 10 in this embodiment.

FIG. 4 is a diagram showing a positional relationship between the magnets 103 and the coils 104 of the linear motor 10 in this embodiment.

In the hollow space of the rod 101, the plurality of cylindrical magnets 103 (segment magnets) are arranged such that the same poles thereof face each other. The three coils 104 constitute one set of three-phase coils formed of U, V, and W phases. A combination of a plurality of sets of three-phase coils constitutes a coil unit. When three-phase currents having three phases, each of which is different from the others by 120°, flow through a plurality of coils 104 divided into three phases of U, V, and W phases, a moving magnetic field moving in the axial direction of the coils 104 is generated.

The rod 101 obtains a thrust force generated by the effects of a magnetic field generated by each magnet 103 as a driving magnet and the moving magnetic field, and is linearly moved relative to the coils 104 in synchronization with the speed of the moving magnetic field.

As shown in FIG. 2, the magnetic sensor 112 used to detect a position of the rod 101 is mounted on one of the end cases 109 which are magnetic sensor housing cases. The magnetic sensor 112 is disposed to be separated from the rod 101 with a predetermined gap. The magnetic sensor 112 detects the change in a direction of the magnetic field (a direction of a magnetic vector) generated by each magnet 103 within the rod 101 due to the linear motion of the rod 101.

Figure 5:
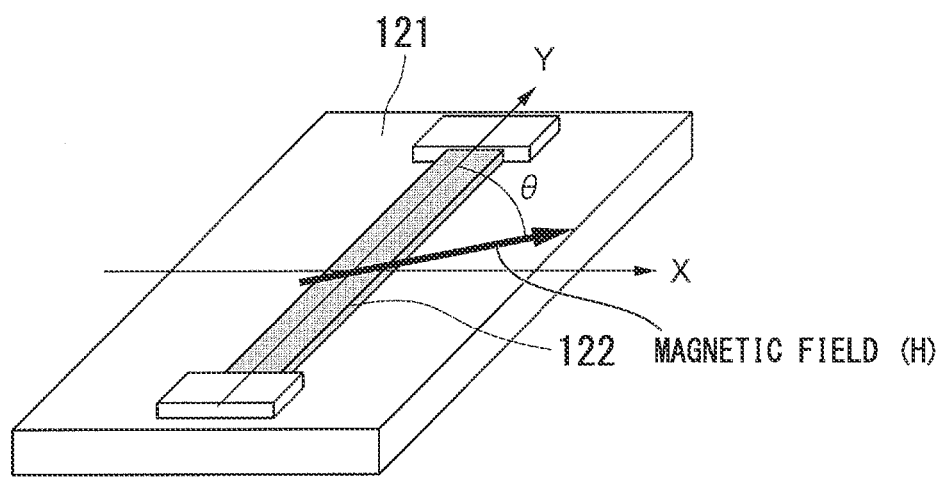
FIG. 5 is a perspective view showing the principle of a magnetic sensor.

As shown in FIG. 5, the magnetic sensor 112 has a Si or glass substrate 121 and a magnetoresistive element 122 which is formed of an alloy (ferromagnetic thin-film metal) having a ferromagnetic metal such as Ni or Fe as a main component formed on the substrate 121.

The magnetic sensor 112 is called an AMR sensor (anisotropic-magneto-resistance element) because the resistance value of the magnetic sensor 112 is changed depending on a specific magnetic field direction (cited reference: "Vertical-Type MR Sensor Technology Data," [online], Oct. 1, 2005, KOHDEN Co., Ltd., "accessed Nov. 7, 2011," the Internet <URL; http://www.hkd.co.jp/technique/img/amr-notel.pdf>).

Figure 6:
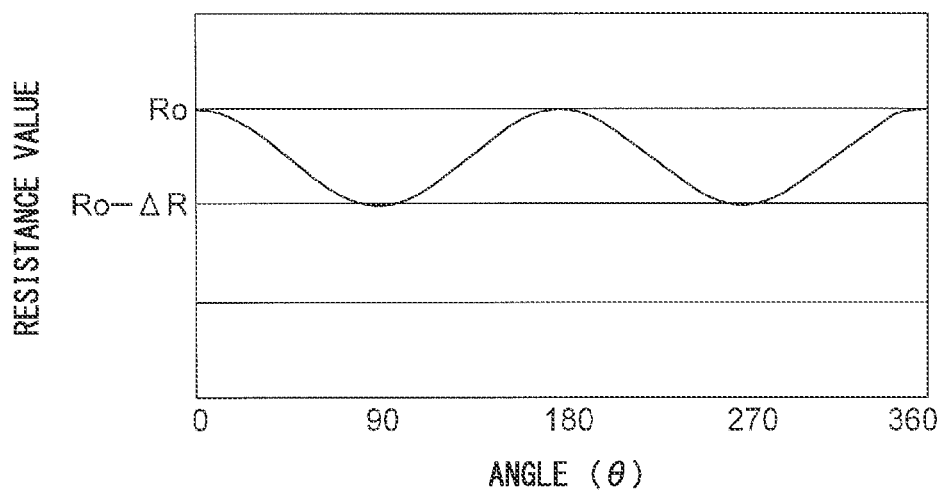
FIG. 6 is a graph showing a relationship between a direction of a magnetic field and a resistance value in an anisotropic-magneto-resistance (AMR) sensor.

FIG. 6 is a graph showing a relationship between the magnetic field direction and the resistance value in the AMR sensor.

It is assumed that the current flows through the magnetoresistive element 122, a magnetic field strength at which the amount of change in resistance is saturated is applied to the magnetoresistive element 122, and an angle θ between a direction of the magnetic field (H) and the current direction Y is varied. At this time, as shown in FIG. 6, the amount of change in resistance (ΔR) is maximized when the current direction is perpendicular to the direction of the magnetic field (θ=90°, 270°), and is minimized when the current direction is parallel to the direction of the magnetic field (θ=0°, 180°). A resistance value R is changed depending on a component of the angle between the current direction and the magnetic field direction as represented by the following Equation (1).

When the magnetic field strength is greater than or equal to the saturated sensitivity, ΔR is a constant, and the resistance value R is not affected by the magnetic field strength.

$$R = R0 - \Delta R \sin 2\theta \quad (1)$$

Figure 7:
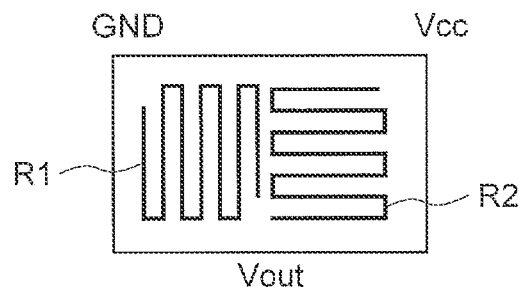
FIG. 7 is a diagram showing an example of a shape of a ferromagnetic thin film metal of the magnetic sensor 112 which detects the direction of the magnetic field even when magnetic field strength is greater than or equal to saturated sensitivity.

R0: the resistance value of the ferromagnetic thin-film metal in the absence of the magnetic field ΔR: the amount of change in resistance θ: the angle which indicates the magnetic field direction FIG. 7 is a diagram showing an example of a shape of a ferromagnetic thin film metal of the magnetic sensor 112 which detects the direction of the magnetic field even when magnetic field strength is greater than or equal to saturated sensitivity.

As shown in FIG. 7, a ferromagnetic thin-film metal element (R1) formed in a longitudinal direction and an element (R2) formed in a lateral direction are connected through wires in series.

The magnetic field in a vertical direction which causes the most change in resistance of the element (R1) causes the least change in resistance of the element (R2). The resistance values R1 and R2 are given by the following Equations (2) and (3).

$$R1 = R0 - \Delta R \sin 2\theta \quad (2)$$

$$R2 = R0 - \Delta R \cos 2\theta \quad (3)$$

Figure 8:
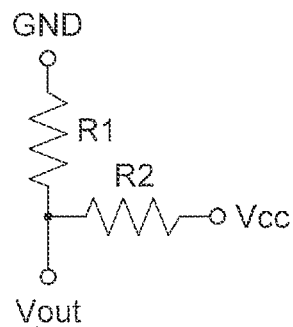
FIG. 8 is a diagram showing an equivalent circuit (half bridge) of the magnetic sensor.

FIG. 8 is a diagram showing an equivalent circuit (half bridge) of the magnetic sensor. The output Vout of the equivalent circuit is given by the following Equation (4).

$$V\text{out} = R1 \cdot V\text{cc}/(R1+R2) \quad (4)$$

When Equations (2) and (3) are substituted into Equation (4) and the equation is rearranged, the following Equations (5-1) and (5-2) are obtained.

$$V\text{out} = V\text{cc}/2 + \alpha \cos 2\theta \quad (5\text{-}1)$$

$$\alpha = \Delta R \cdot V\text{cc}/2(2R0-\Delta R) \quad (5\text{-}2)$$

Figure 9:
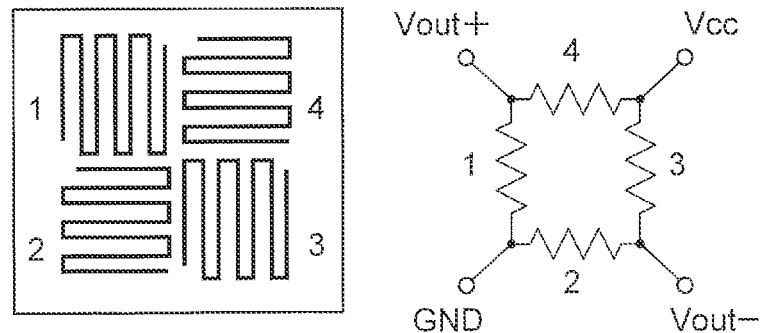
FIG. 9 is a diagram showing an example of a shape of a ferromagnetic thin film metal of the magnetic sensor for detecting the direction of the magnetic field.

FIG. 9 is a diagram showing an example of the shape of a ferromagnetic thin film metal of the magnetic sensor used to detect the direction of the magnetic field. As illustrated in FIG. 9, when the shape of the ferromagnetic thin-film metal is formed, it is possible to perform amplification and improvement of stability of the midpoint potential using two outputs Vout+ and Vout−.

The change in the magnetic field direction and the output of the magnetic sensor 112 when the rod 101 is linearly moved will be described.

Figure 10:
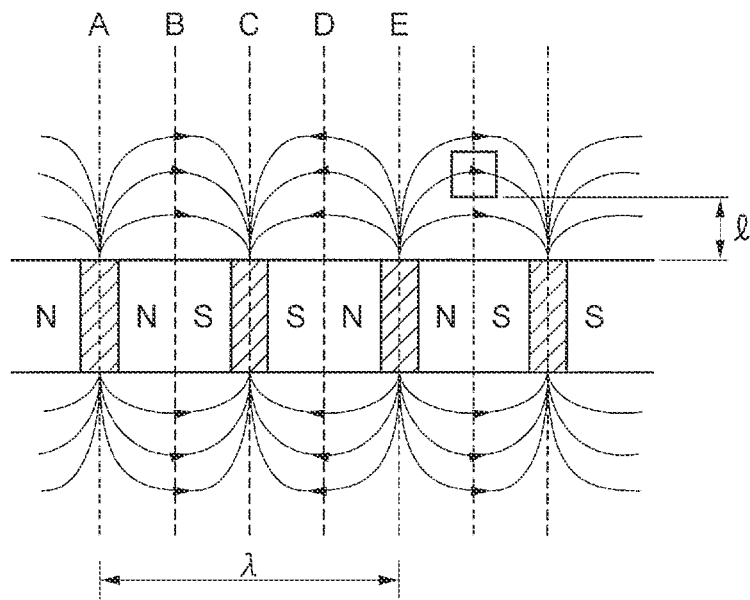
FIG. 10 is a diagram showing a positional relationship between the magnetic sensor 112 and a rod 101.

FIG. 10 is a diagram showing a positional relationship between the magnetic sensor 112 and the rod 101.

As shown in FIG. 10, the magnetic sensor 112 is disposed at the position of a gap 1 to which the magnetic field strength greater than or equal to the saturated sensitivity is applied such that the change in the direction of the magnetic field affects the sensor surface.

At this time, when the magnetic sensor 112 is moved by a distance λ from a position A to a position E along the rod 101, the output of the magnetic sensor 112 is as follows.

Figure 11:
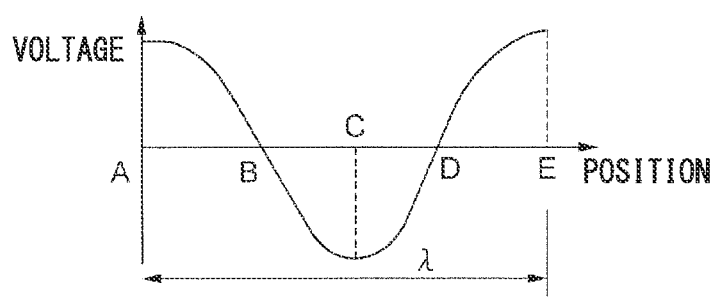
FIG. 11 is a diagram showing an example of a signal output by the magnetic sensor 112.

FIG. 11 is a diagram showing an example of a signal output by the magnetic sensor 112.

As shown in FIG. 11, when the rod 101 is linearly moved by the distance λ, the direction of the magnetic field rotates once on the sensor surface. A voltage signal at that time is a sine wave signal of one cycle. More specifically, the voltage Vout represented by Equation (5-1) is a sine wave signal of two cycles.

However, when a bias magnetic field is applied at an angle of 45° in an extension direction of the element of the magnetic sensor 112, the cycle is halved and an output waveform of one cycle is obtained when the rod 101 is linearly moved by λ.

Figure 12A:
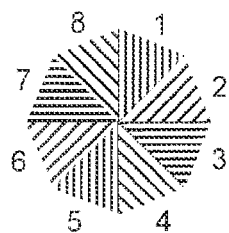
FIG. 12A is a diagram showing a magnetic sensor using two sets of full bridge configurations.
Figure 12B:
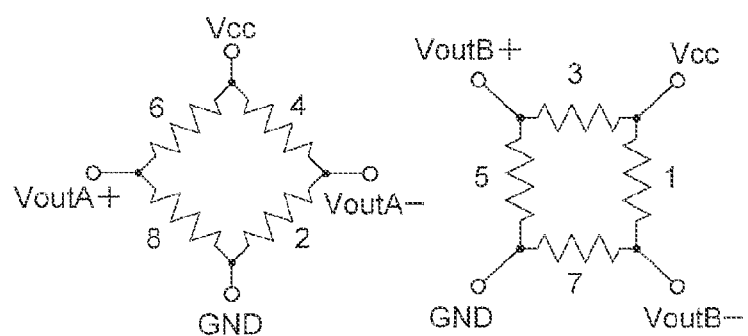
FIG. 12B is a diagram showing a magnetic sensor using two sets of full bridge configurations.

As shown in FIG. 12B, in order to detect the direction of the motion, it is only necessary to form elements of two sets of full-bridge configurations to be tilted at an angle of 45° with respect to each other on a single substrate.

Figure 13:
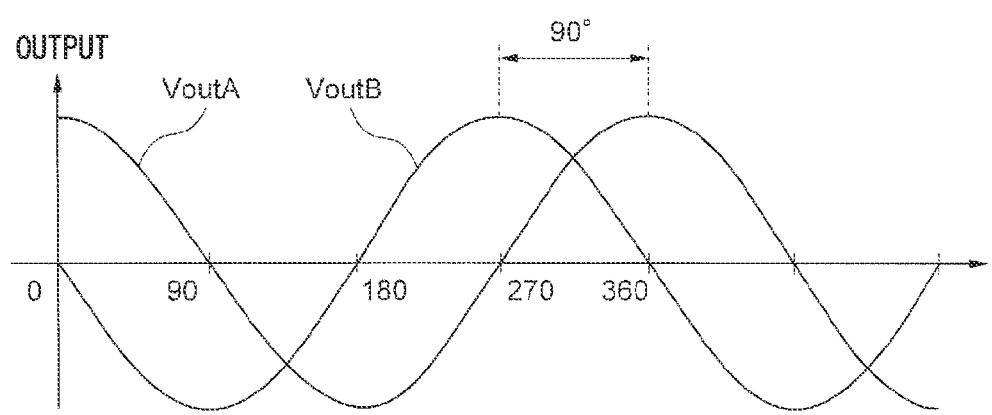
FIG. 13 is a graph showing a signal output by the magnetic sensor 112.

As shown in FIG. 13, outputs Vout A and Vout B obtained by two sets of full-bridge circuits are a cosine wave signal and a sine wave signal having a phase difference of 90° from each other.

Figure 14:
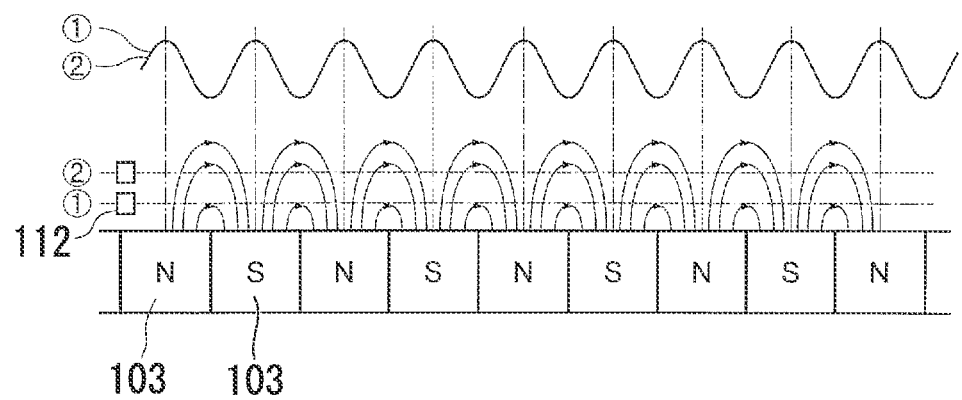
FIG. 14 is a conceptual diagram showing a positional relationship between the rod 101 and the magnetic sensor 112 and a signal output by the magnetic sensor 112.

As shown in FIG. 12A, in the this embodiment, in the magnetic sensor 112, the elements of the two sets of full-bridge configurations are formed to be tilted at the angle of 45° to each other on the single substrate. Therefore, the magnetic sensor 112 detects the change of the direction of the magnetic field of the rod 101. Hence, as shown in FIG. 14, even when the mounting position of the magnetic sensor 112 is shifted from (1) to (2), a change in the sine wave signal and the cosine wave signal (the outputs Vout A and Vout B) output by the magnetic sensor 112 is small.

Figure 15:
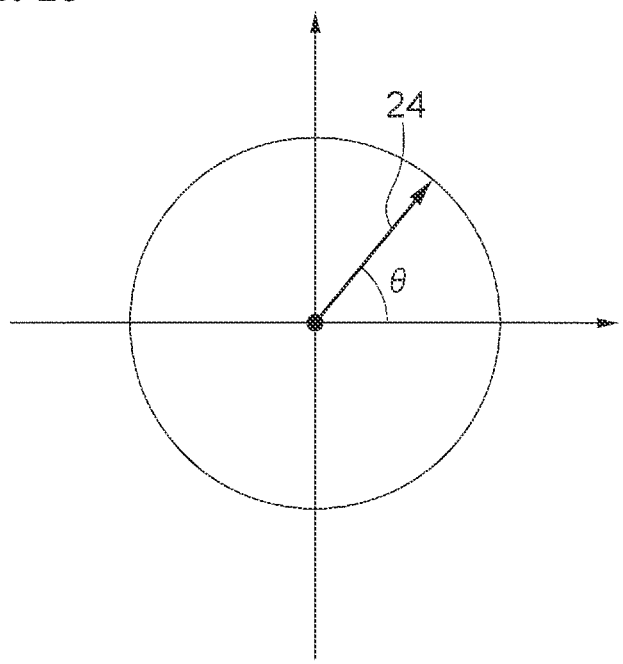
FIG. 15 is a diagram showing a Lissajous figure drawn by outputs VoutA and VoutB of the magnetic sensor 112.

FIG. 15 is a diagram showing a Lissajous figure drawn by the outputs Vout A and Vout B of the magnetic sensor 112.

Because there is a small change in the output of the magnetic sensor 112, it is difficult to change a size of a circle shown in FIG. 15. Therefore, it is possible to precisely detect a direction θ of a magnetic vector 24. Even though the gap 1 between the rod 101 and the magnetic sensor 112 is not managed with high accuracy, it is possible to detect the exact position of the rod 101. Accordingly, it becomes easy to control the mounting of the magnetic sensor 112. Further, the backlash of the mounting of the rod 101 guided by the bush 108 can be allowed. Furthermore, the rod 101 can be slightly curved.

Figure 16:
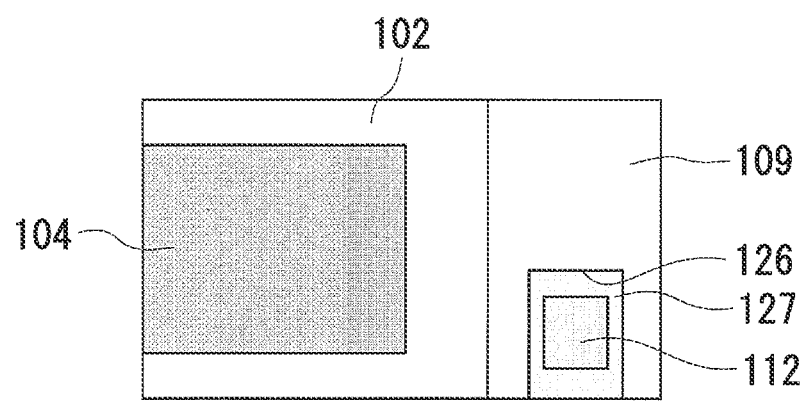
FIG. 16 is a diagram showing the magnetic sensor 112 mounted on an end case 109.

FIG. 16 is a diagram showing the magnetic sensor 112 mounted on the end case 109.

A magnetic sensor housing portion 126 formed of a space used to house the magnetic sensor 112 is provided in the end case 109. After the magnetic sensor 112 is disposed in the magnetic sensor housing portion 126, the periphery of the magnetic sensor 112 is filled with a filler 127. Thereby, the magnetic sensor 112 is fixed to the end case 109.

The magnetic sensor 112 has temperature characteristics and the output thereof changes depending on a change in temperature. In order to reduce the effect of heat generated by the coils 104, a material having lower thermal conductivity than the coil housing case 102 is used for the end case 109 and the filler 127. For example, an epoxy-type resin is used for the coil housing case 102, and polyphenylene sulfide (PPS) is used for the end case 109 and the filler 127.

Figure 17:
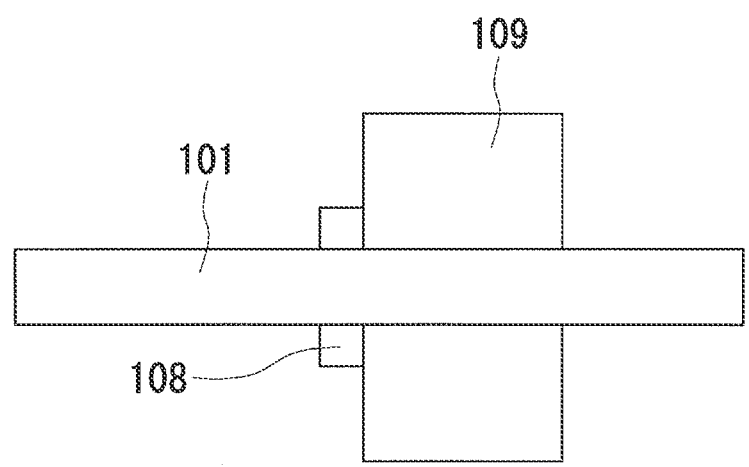
FIG. 17 is a diagram showing a bush 108 which is a bearing mounted on the end case 109.

FIG. 17 is a diagram showing the bush 108 which is a bearing mounted on the end case 109.

By making the end case 109 have a bearing function, it is possible to prevent the gap between the rod 101 and the magnetic sensor 112 from fluctuating.

Figure 18:
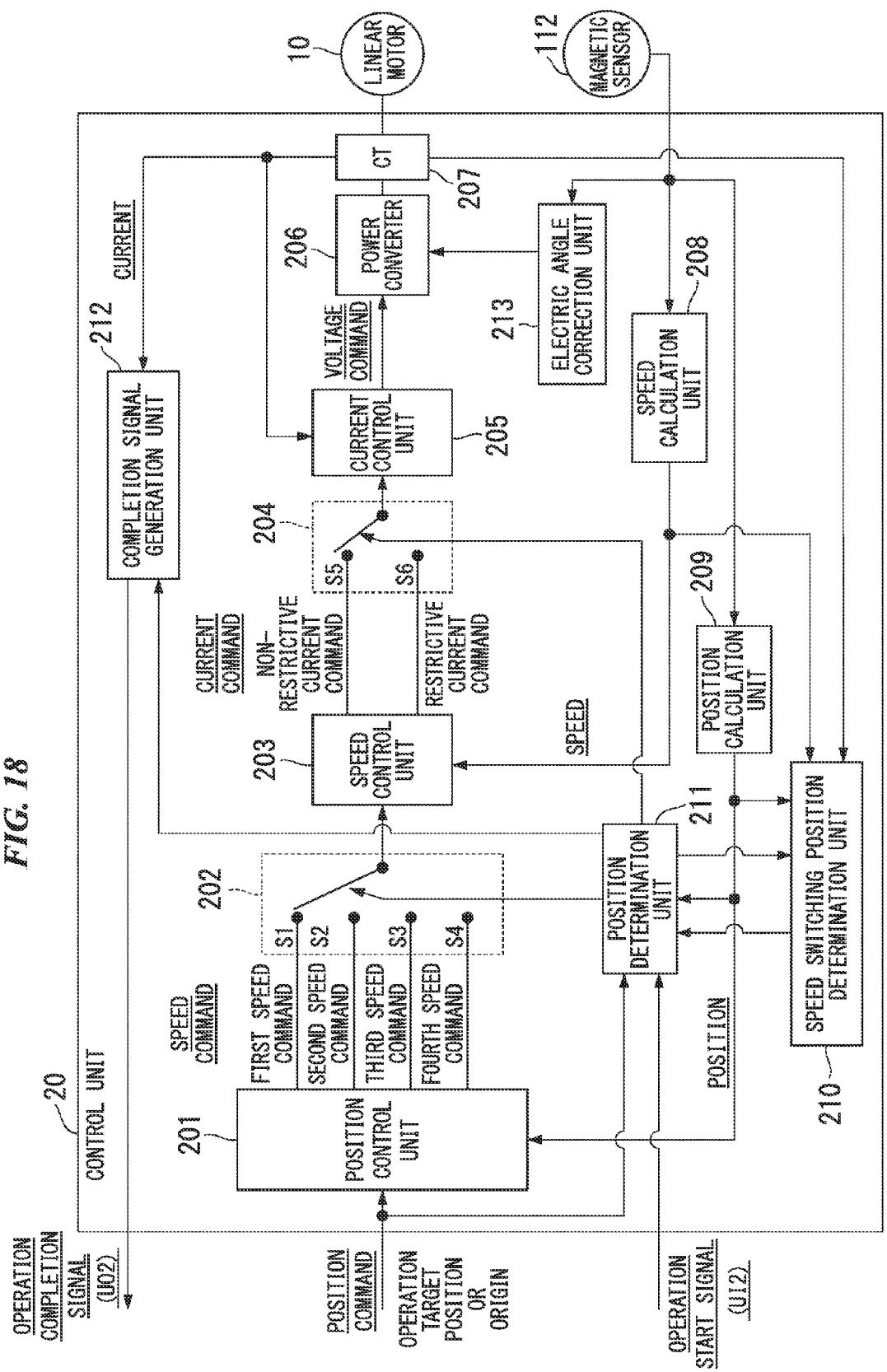
FIG. 18 is a schematic block diagram showing a configuration of a control unit 20 in this embodiment.

FIG. 18 is a schematic block diagram showing a configuration of the control unit 20 in this embodiment.

The control unit 20 includes a position control unit 201, a switch unit 202, a speed control unit 203, a switch unit 204, a current control unit 205, a power converter 206, a current transformer (CT) 207, a speed calculation unit 208, a position calculation unit 209, a speed switching position determination unit 210, a position determination unit 211, a completion signal generation unit 212, and an electric angle correction unit 213.

Hereinafter, the case in which a position of the pressing body 11 when the rod 101 is maximally raised is set as the origin serving as a reference of the position of the pressing body 11 will be described.

The position control unit 201 calculates a speed command based on a position command input from outside and information representing a position of the rod 101 calculated by the position calculation unit 209. In addition, the position control unit 201 pre-stores first to fourth speeds (FL1SPD to FL4SPD), and outputs four speed commands (first to fourth speed commands) based on the first to fourth speeds.

The first speed command is a command indicating a speed at which the rod 101 moves from a predetermined origin when the pressing body 11 mounted on the tip of the rod 101 moves to the vicinity (force limit (FL) mode start position) of the workpiece 33. In the first speed command, an upper limit value of the speed at which the rod 101 is moved is predetermined as the first speed (FL1SPD). For example, a highest speed when the linear motor 10 moves the rod 101 is designated as the first speed (FL1SPD). The second speed command is a command indicating a movement speed of the rod 101 when the pressing body 11 moves to come in contact with the workpiece 33 from the vicinity of the workpiece 33. In the second speed command, the speed at which the rod 101 is moved is predetermined as the second speed (FL2SPD). The second speed (FL2SPD) is a speed lower than the first speed (FL1SPD) and is set to a speed at which a predetermined pressure (load) or less is applied to the workpiece 33 when the pressing body 11 comes in contact with the workpiece 33.

The third speed command is a command indicating a speed when the rod 101 and the pressing body 11 are moved in a direction away from the workpiece 33 after the pressing body 11 abuts the workpiece 33 and the workpiece 33 is mounted on the substrate 31. In the third speed command, a speed at which the rod 101 is moved is predetermined as the third speed (FL3PSD). The third speed command is a command to be used when the rod 101 and the pressing body 11 are moved toward the origin.

The fourth speed command is a command indicating a speed when the rod 101 is moved toward the origin after the pressing body 11 abuts the workpiece 33 and the workpiece 33 is mounted on the substrate 31. In the fourth speed command, the upper limit value of the speed at which the rod 101 is moved is predetermined as the fourth speed (FL4SPD). In addition, the fourth speed (FL4SPD) is set to a speed higher than the third speed (FL3SPD). For example, like the first speed (FL1SPD), the fourth speed (FL4SPD) is set to a highest speed when the linear motor 10 moves the rod 101.

The switch unit 202 selects any one of the four speed commands output by the position control unit 201 based on the control of the position determination unit 211. The speed command selected by the switch unit 202 and speed information indicating the speed of the rod 101 calculated by the speed calculation unit 208 are input to the speed control unit 203. The speed control unit 203 calculates a current value used to set the movement speed of the rod 101 to the speed represented by the speed command based on a deviation between the speed indicated by the speed command and the speed indicated by the speed information.

In addition, the speed control unit 203 outputs the calculated current value (a non-restrictive current command), and outputs a restrictive current command which is a current command to set a predetermined current limit value (FL2I) to an upper limit value.

When the calculated current value is less than or equal to the current limit value (FL2I), the non-restrictive current command and the restrictive current command represent the same current value. On the other hand, when the calculated current value is greater than the current limit value (FL2I), the non-restrictive current command represents the calculated current value, and the restrictive current command represents the current limit value (FL2I). The current limit value (FL2I) is predetermined based on a thrust force of the linear motor 10 and the force by which the workpiece 33 is pressed when the workpiece 33 is mounted on the substrate 31.

The switch unit 204 selects either one of the restrictive current command and the non-restrictive current command output by the speed control unit 203 based on the control of the position determination unit 211.

Based on the current command selected by the switch unit 204 and a current value of the current flowing through the linear motor 10 measured by the CT 207, the current control unit 205 calculates a voltage command used to reduce a deviation between the selected current command and the measured current value.

The power converter 206 applies a voltage to the coils 104 of U, V, and W phases of the linear motor 10 based on the electric angle input from the electric angle correction unit 213 and the voltage command calculated by the current control unit 205. The CT 207 is mounted on a power line which connects the power converter 206 and the linear motor 10. In addition, the CT 207 measures a value of a current flowing through the power line. In addition, the CT 207 outputs a signal representing the measured current value to the current control unit 205, the speed switching position determination unit 210, and the completion signal generation unit 212.

The speed calculation unit 208 calculates the movement speed of the rod 101 based on the amounts of changes in the sine wave signal and the cosine wave signal (the outputs Vout A and Vout B) output from the magnetic sensor 112.

The position calculation unit 209 calculates the amount of movement of the rod 101 from the origin based on the amounts of changes in the sine wave signal and the cosine wave signal (the outputs Vout A and Vout B) output from the magnetic sensor 112. The position calculation unit 209 outputs position information representing the position of the rod 101 to the position control unit 201, the speed switching position determination unit 210, and the position determination unit 211.

The speed switching position determination unit 210 outputs a signal representing an FL mode start position to the position determination unit 211. The FL mode start position is a position at which the speed command is switched from the first speed command to the second speed command when the rod 101 and the pressing body 11 move toward the workpiece 33 and the substrate 31.

In addition, the speed switching position determination unit 210 outputs a signal representing a speed switching position (FL3POS) to the position determination unit 211. The speed switching position is a position at which the speed command is switched from the third speed command to the fourth speed command when the rod 101 is moved toward the origin after the workpiece 33 is pressed against the substrate 31.

In addition, the speed switching position determination unit 210 outputs the pre-stored initial switching position (FL2POSSUB) as the FL mode start position to the position determination unit 211 when a process of pressing the workpiece 33 is initially performed. The speed switching position determination unit 210 updates the FL mode start position so as to shorten the time necessary for a process of pressing the workpiece and mounting the workpiece 33 on the substrate 31 based on the speed and position at which the rod 101 moves when the workpiece 33 has been initially pressed and the current flowing through the linear motor 10.

Thereafter, the speed switching position determination unit 210 outputs the updated FL mode start position to the position determination unit 211. An initial switching position is a position predetermined according to the height of the workpiece 33 and is a position at which the deceleration of the pressing body 11 (the rod 101 of the linear motor 10) starts so that unnecessary impact is not imposed on the workpiece 33 when the pressing body 11 comes in contact with the workpiece 33. As the speed switching position (FL3POS), for example, the same position as the initial switching position (FL2POSSUB) is preset.

The position determination unit 211 serving as the movement control unit controls the switch unit 202 to select any one of the four speed commands output by the position control unit 201 based on a position command and an operation start signal input from the outside and the position information output by the position calculation unit 209. In addition, the position determination unit 211 controls the switch unit 204 to select either one of the two current commands output by the speed control unit 203 based on the position command, the operation start signal, and the position information.

The completion signal generation unit 212 outputs an operation completion signal (UO2) to the outside if the current value measured by the CT 207 reaches a predetermined current limit value (FL2I) when the pressing body 11 presses the workpiece 33.

The electric angle correction unit 213 calculates an electric angle from the sine wave signal and the cosine wave signal output by the magnetic sensor 112. In addition, according to control of the position determination unit 211, the electric angle correction unit 213 outputs either the calculated electric angle or an electric angle obtained by correcting the calculated electric angle to the power converter 206.

An operation when the machining device 1 initially presses the workpiece 33 will be described.

Figure 19:
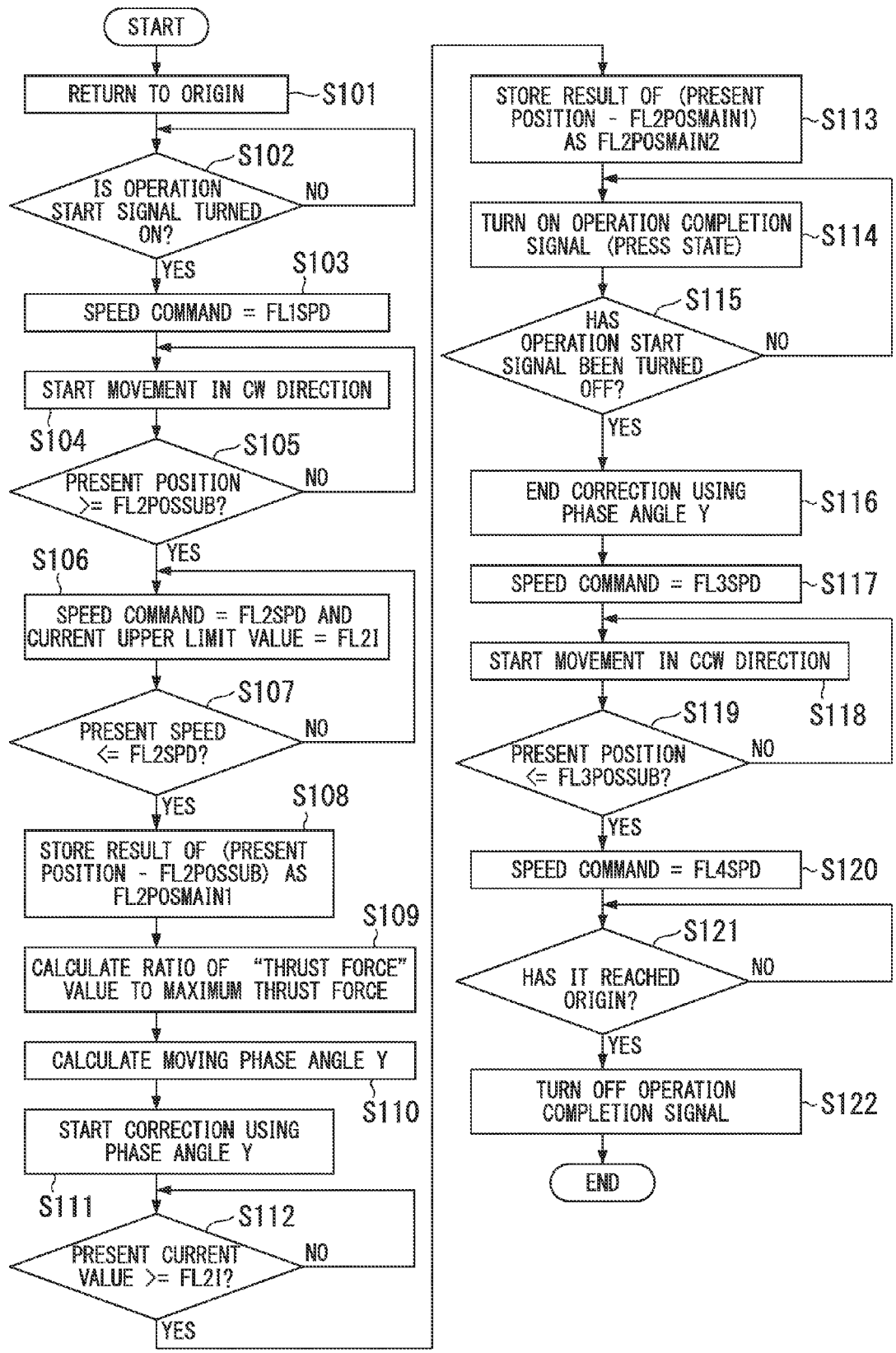
FIG. 19 is a flowchart showing an operation when the machining device 1 in this embodiment initially presses a workpiece 33.

FIG. 19 is a flowchart showing an operation when the machining device 1 in this embodiment initially presses the workpiece 33. A direction in which the rod 101 is close to the workpiece 33 and the substrate 31 is assumed to be a CW direction and a direction in which the rod 101 is away from the workpiece 33 and the substrate 31 is assumed to be a CCW direction.

When the position command based on the position of the workpiece 33 is input from the outside, the control unit 20 starts to drive the linear motor 10 and performs origin return processing of moving the pressing body 11 to the origin (step S101).

When the origin return processing is completed, the position determination unit 211 determines whether an operation completion signal (UI2) from outside is turned on (step S102), and waits for an operation start signal to be turned on (step S102: NO). When the operation start signal is turned on in step S102 (step S101: YES), the position determination unit 211 causes the switch unit 202 to select the first speed command and causes the switch unit 204 to select a non-restrictive current command (step S103). Then, the position determination unit 211 causes the rod 101 of the linear motor 10 to move toward the workpiece 33 (in the CW direction) (step S104).

The position determination unit 211 determines whether the position of the pressing body 11 has reached an initial switching position (FL2POSSUB) (step S105), and the pressing body 11 causes the linear motor 10 to be driven using the first speed command until the pressing body 11 reaches the initial switching position (FL2POSSUB) (step S105: NO).

When the pressing body 11 reaches the initial switching position (FL2POSSUB) in step S105 (step S105: YES), the position determination unit 211 causes the switch unit 202 to select the second speed command and causes the switch unit 204 to select the restrictive current command (step S106). Then, the position determination unit 211 decreases the movement speed of the rod 101.

After the second speed command has been selected, the speed switching position determination unit 210 determines whether the movement speed of the rod 101 is less than or equal to the second speed (FL2SPD) (step S107), the determination is iterated until the movement speed of the rod 101 is less than or equal to the second speed (FL2SPD) (step 107: NO).

When the movement speed of the rod 101 is less than or equal to the second speed in step S107 (step S107: YES), the speed switching position determination unit 210 calculates a difference (FL2POSMAIN1) between the present position of the pressing body 11 and the initial switching position (FL2POSSUB) and stores the calculated difference (FL2POSMAIN1) (step S108).

The electric angle correction unit 213 calculates a ratio X (="thrust force limit value"/"maximum thrust force") of the "thrust force limit value" to the maximum thrust force of the linear motor 10 (step S109).

The thrust force limit value corresponds to a maximum value of a pressure (load) which may be applied to the workpiece 33 and the substrate 31.

The electric angle correction unit 213 calculates a phase angle Y corresponding to the ratio X of the thrust force calculated in step S109 using the following Equation (6) (step S110).

$$Y = \cos^{-1}(X) \tag{6}$$

In Equation (6), "cos−1" is an arccosine function.

The electric angle correction unit 213 outputs a corrected electric angle obtained in a correction process of adding the phase angle Y to the electric angle to the power converter 206 in place of the electric angle calculated from the sine wave signal and the cosine wave signal output by the magnetic sensor 112 (step S111).

Thereafter, while the electric angle correction unit 213 outputs the corrected electric angle, the power converter 206 applies voltages of phases advanced by the phase angle Y with respect to a magnetic pole position of the rod 101 to the U, V, and W phase coils 104.

The correction using the phase angle Y may be performed by subtracting the phase angle Y with respect to the electric angle. In this case, the power converter 206 is configured to apply voltages of phases advanced by the phase angle Y with respect to the magnetic pole position of the rod 101 to the U, V, and W phase coils 104.

The speed switching position determination unit 210 determines whether the current value measured by the CT 207 is greater than or equal to the current limit value (FL2I) (step S112), and waits for the measured current value to reach the current limit value (FL2I) (step S112: NO).

When the speed switching position determination unit 210 determines that the current value measured by the CT 207 reaches the current limit value (FL2I) and the measured current value is greater than or equal to the current limit value (FL2I) (step S112: YES) in step S112, a position obtained by subtracting a difference (FL2POSMAIN1) calculated in step S108 from the present position of the pressing body 11 is stored as a new FL mode start position (FL2POSMAIN2) (step S113). At this time, the completion signal generation unit 212 turns on the operation completion signal (UO2) and outputs the operation completion signal (UO2) to the outside (step S114). In step S114, when the new FL mode start position (FL2POSMAIN2) is calculated, a predetermined distance Δd may be configured to be provided as a margin. Specifically, a position obtained by subtracting the difference (FL2POSMAIN1) and the distance Δd from the present position of the pressing body 11 may be configured to be set as the new FL mode start position (FL2POSMAIN2).

The position determination unit 211 determines whether the operation start signal input from the outside is turned off (step S115), and waits for the operation start signal to be turned off (step S115: NO).

When the operation start signal is turned off in step S115 (step S115: YES), the position control unit 201 calculates the speed command according to the position command used to set the origin as a movement destination. The electric angle correction unit 213 outputs the electric angle calculated from the sine wave signal and the cosine wave signal output by the magnetic sensor 112 to the power converter 206 in place of the corrected electric value (step S116). That is, the driving of the linear motor 10 using the corrected electric angle ends.

The position determination unit 211 causes the switch unit 202 to select the third speed command and causes the switch unit 204 to select the restrictive current command (step S117). Then, the position determination unit 211 causes the rod 101 to move toward the origin (in the CCW direction) (step S118).

The position determination unit 211 determines whether the pressing body 11 reaches the speed switching position (FL3POS) (step S119), and waits for the pressing body 11 to reach the speed switching position (FL3POS) (step S119: NO).

When the pressing body 11 reaches the speed switching position (FL3POS) in step S119 (step S119: YES), the position determination unit 211 causes the switch unit 202 to select the fourth speed command (step S120).

The position determination unit 211 determines whether the pressing body 11 has reached the origin (step S121) and waits for the pressing body 11 to reach the origin (step S121: NO).

When the pressing body 11 reaches the origin in step S121, the position determination unit 211 outputs a signal indicating that the pressing body 11 has reached the origin to the completion signal generation unit 212 and the completion signal generation unit 212 turns off the operation completion signal (step S122). Thus, an operation of initially pressing the workpiece 33 against the substrate 31 ends.

Figure 20:
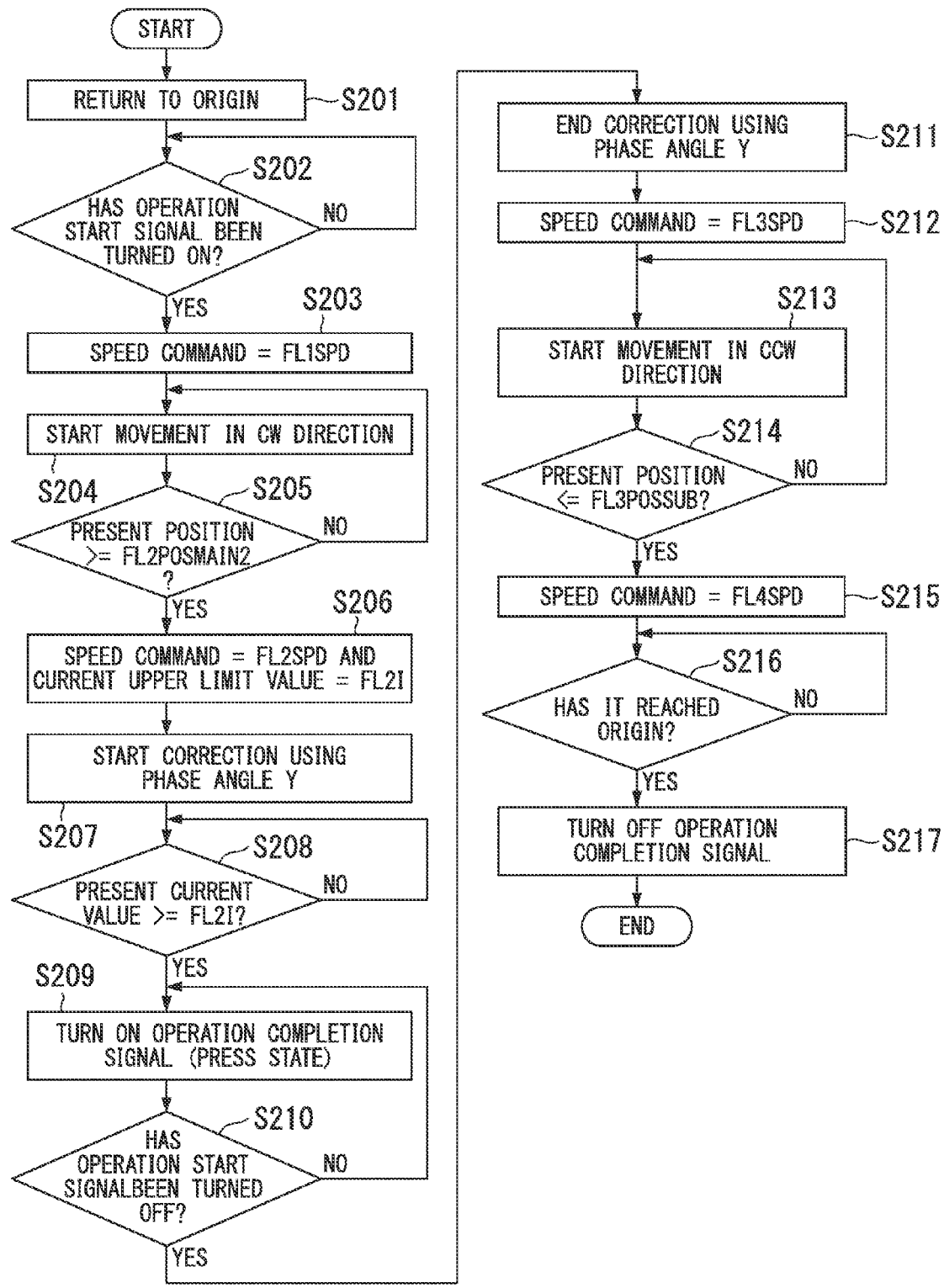
FIG. 20 is a flowchart showing an operation in which the machining device 1 presses the workpiece 33 against the substrate 31 using an updated FL mode start position in this embodiment.

FIG. 20 is a flowchart showing an operation in which the machining device 1 presses the workpiece 33 against the substrate 31 using an updated FL mode start position in this embodiment.

When a position of the substrate 31 at which the workpiece 33 is mounted or the position command based on the position of the workpiece 33 is input from the outside, the control unit 20 starts to drive the linear motor 10 and performs origin return processing of returning the pressing body 11 to the origin (step S201).

When the origin return processing is completed, the position determination unit 211 determines whether the operation start signal (UI2) from the outside is turned on (step S202), and waits for the operation start signal to be turned on (step S202: NO). When the operation start signal is turned on in step S202 (step S202: YES), the position determination unit 211 causes the switch unit 202 to select the first speed command and causes the switch unit 204 to select the non-restrictive current command (step S203). Then, the position determination unit 211 causes the rod 101 of the linear motor 10 to move toward the workpiece 33 (in the CW direction) (step S204).

The position determination unit 211 determines whether the position of the pressing body 11 has reached the FL mode start position (FL2POSMAIN2) (step S205), the pressing body 11 causes the linear motor 10 to be driven using the first speed command until the pressing body 11 reaches the FL mode start position (FL2POSMAIN2) (step S205: NO).

When the pressing body 11 reaches the FL mode start position (FL2POSMAIN2) in step S205 (step S205: YES), the position determination unit 211 causes the switch unit 202 to select the second speed command and causes the switch unit 204 to select the restrictive current command (step S206). Then, the position determination unit 211 decreases the movement speed of the rod 101.

When the movement speed of the rod 101 is less than or equal to the second speed, the electric angle correction unit 213 outputs a corrected electric angle obtained in a correction process of adding the phase angle Y to the electric angle to the power converter 206 in place of the electric angle calculated from the sine wave signal and the cosine wave signal output by the magnetic sensor 112 (step S207).

The position determination unit 211 determines whether the current value measured by the CT 207 is greater than or equal to the current limit value (FL2I) (step S208), and waits for the measured current value to reach the current limit value (FL2I) (step S208: NO).

Upon determining that the current value reaches the current limit value (FL2I) and the measured current value is greater than or equal to the current limit value (FL2I) (step S208: YES) in step S208, the position determination unit 211 outputs a signal representing that the current value has reached the current limit value (FL2I) to the completion signal generation unit 212. The completion signal generation unit 212 turns on the operation completion signal (UO2) and outputs the operation completion signal (UO2) to the outside (step S209).

The position determination unit 211 determines whether the operation start signal input from the outside is turned off (step S210), and waits for the operation start signal to be turned off (step S210: NO).

When the operation start signal is turned off in step S210 (step S210: YES), the position control unit 201 calculates the speed command according to the position command used to set the origin as a movement destination. The electric angle correction unit 213 outputs the electric angle calculated from the sine wave signal and the cosine wave signal output by the magnetic sensor 112 to the power converter 206 in place of the corrected electric value (step S211). That is, the driving of the linear motor 10 using the corrected electric angle ends.

The position determination unit 211 causes the switch unit 202 to select the third speed command and causes the switch unit 204 to select the restrictive current command (step S212). Then, the position determination unit 211 causes the rod 101 to move toward the origin (in the CCW direction) (step S213).

The position determination unit 211 determines whether the pressing body 11 reaches the speed switching position (FL3POS) (step S214), and waits for the pressing body 11 to reach the speed switching position (FL3POS) (step S214: NO).

When the pressing body 11 reaches the speed switching position (FL3POS) in step S214 (step S214: YES), the position determination unit 211 causes the switch unit 202 to select the fourth speed command (step S215).

The position determination unit 211 determines whether the pressing body 11 has reached the origin (step S216) and waits for the pressing body 11 to reach the origin (step S216: NO).

When the pressing body 11 reaches the origin in step S216, the position determination unit 211 outputs a signal indicating that the pressing body 11 has reached the origin to the completion signal generation unit 212 and the completion signal generation unit 212 turns off the operation completion signal (UO2) (step S217). Thus, an operation of initially pressing the workpiece 33 against the substrate 31 ends.

Figure 21:
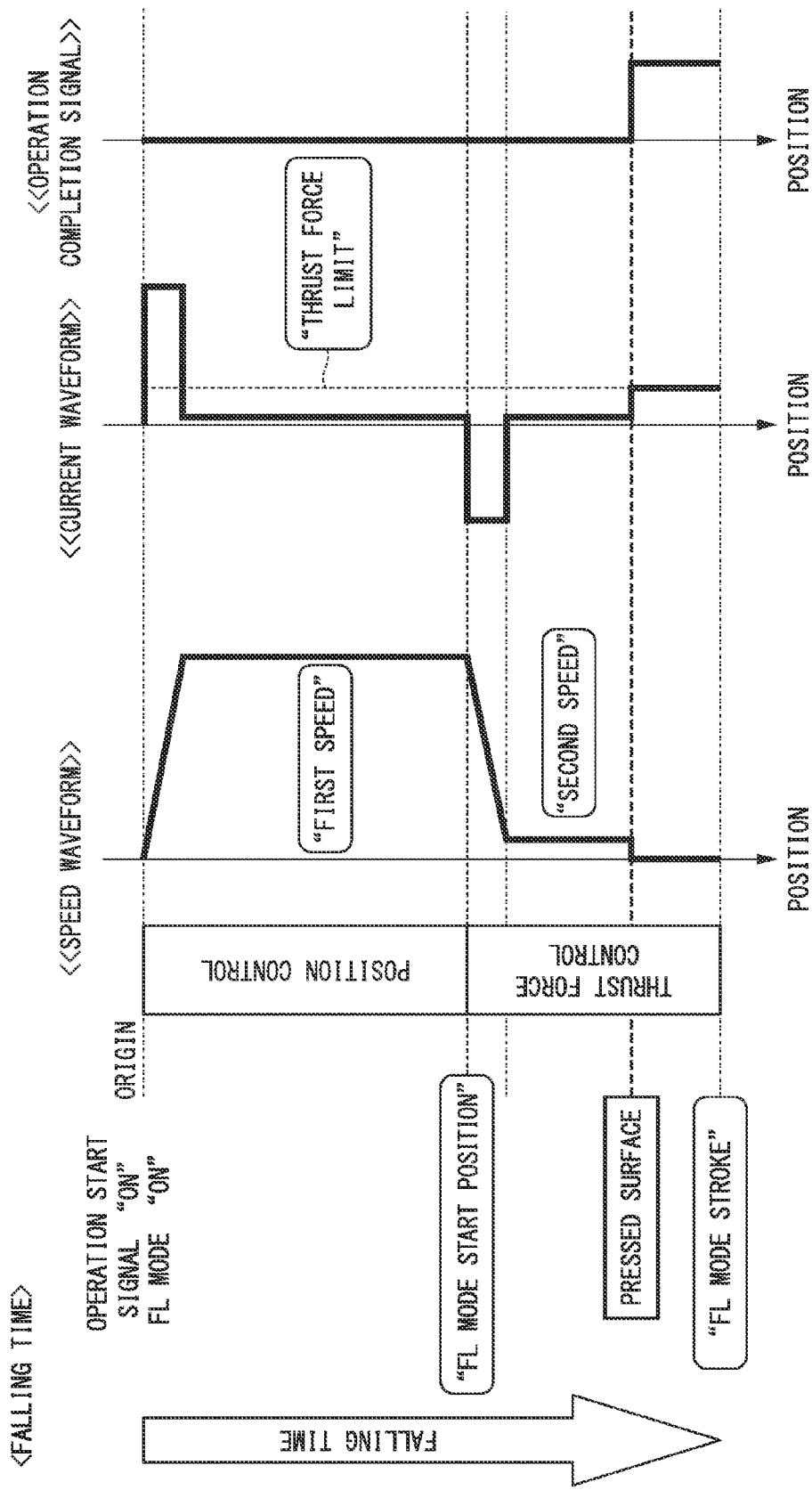
FIG. 21 is a waveform diagram showing variations of a speed, a current, and an operation completion signal in an operation of steps S202 to S209 of FIG. 20.

FIG. 21 is a waveform diagram showing variations of a speed, a current, and an operation completion signal in an operation of steps S202 to S209 of FIG. 20. In FIG. 21, the vertical axis represents the position of the pressing body 11.

When the operation start signal is turned on, the control unit 20 causes the pressing body 11 to move toward the workpiece 33 at the first speed (FL1SPD). When the pressing body 11 reaches the FL mode start position (FL2POSMAIN2), the control unit 20 decelerates the pressing body 11 from the first speed (FL1SPD) to a second speed (FL2SPD).

The control unit 20 causes the pressing body 11 to move toward the workpiece 33 at the second speed (FL2SPD) and presses the workpiece 33 toward the substrate 31. At this time, the control unit 20 turns on the operation completion signal when the force by which the pressing body 11 is pressed against the workpiece 33 is greater than a force corresponding to the current limit value (FL2I).

Figure 22:
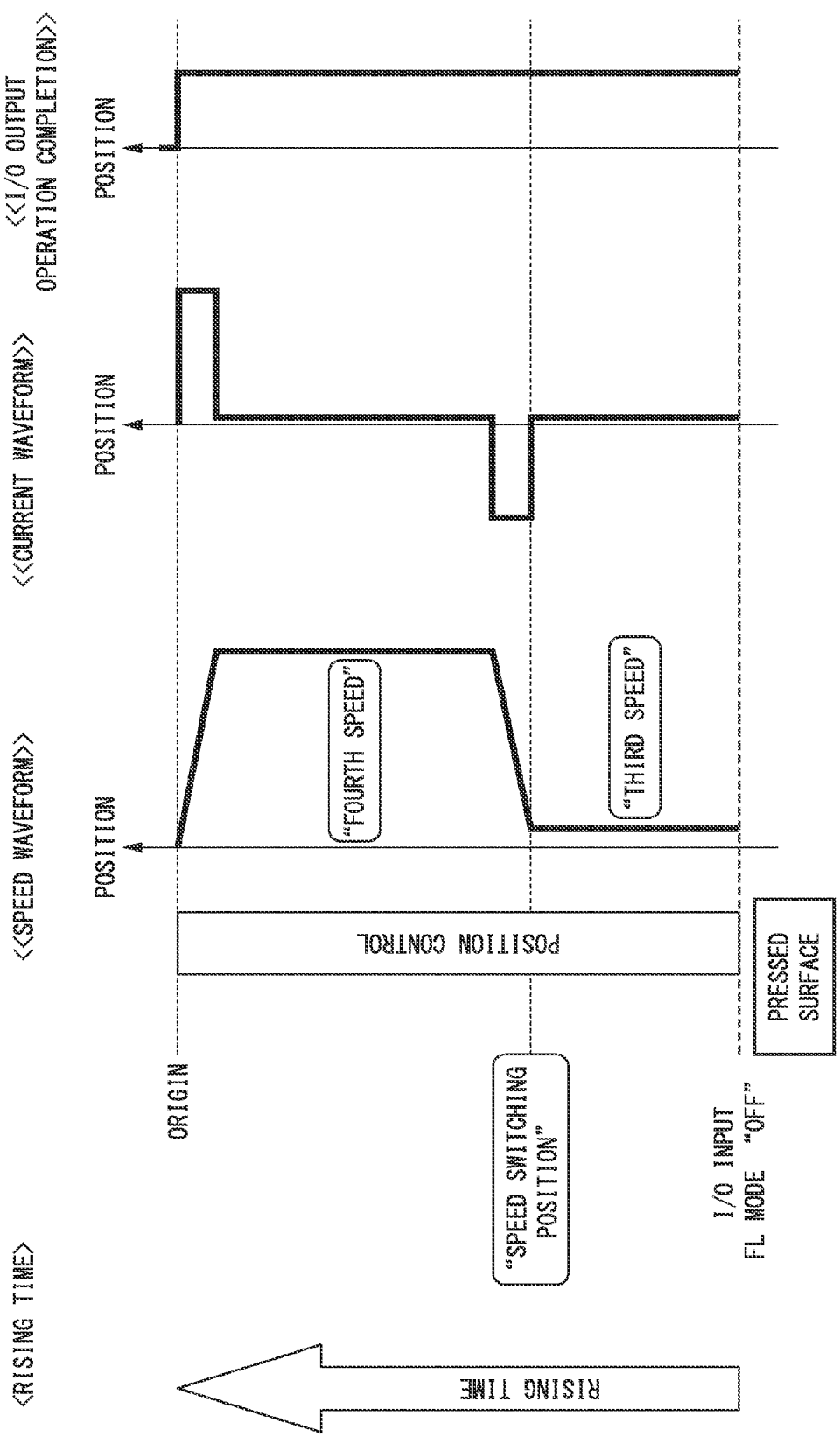
FIG. 22 is a waveform diagram showing variations of a speed, a current, and an operation completion signal in an operation of steps S212 to S217 of FIG. 20.

FIG. 22 is a waveform diagram showing variations of a speed, a current, and an operation completion signal in an operation of steps S212 to S217 of FIG. 20. In FIG. 22, the vertical axis represents the position of the pressing body 11.

After pressing the pressing body 11 against the workpiece 33, the control unit 20 causes the pressing body 11 to be raised while moving toward the origin at a third speed (FL3SPD). The control unit 20 causes the pressing body 11 to move toward the origin at a fourth speed (FL4SPD) faster than the third speed (FL3SPD) when the pressing body 11 reaches the speed switching position.

The control unit 20 decreases the movement speed of the rod 101 of the linear motor 10 so that the speed of the pressing body 11 becomes zero at the origin, and turns off the operation completion signal when the pressing body 11 reaches the origin.

As described above, the machining device 1 controls the linear motor 10 by combining position control, speed control, and current control in a section until the pressing body 11 reaches the FL mode start position (FL2POSMAIN2) after the driving of the linear motor 10 starts. In addition, the machining device 1 controls the linear motor 10 by combining the speed control and the current control in a section until the pressing body 11 comes in contact with the workpiece 33 from the FL mode start position (FL2POSMAIN2). In addition, the machining device 1 controls the linear motor 10 in the current control after the pressing body 11 has come in contact with the workpiece 33. That is, the machining device 1 switches control according to the position of the pressing body 11.

According to the control according to the position of the pressing body 11, the machining device 1 performs deceleration to the second speed slower than the first speed before the pressing body 11 comes in contact with the workpiece 33, thereby pressing the pressing body 11 against the workpiece 33 without imposing unnecessary impact on the workpiece 33. That is, the machining device 1 can improve the accuracy of the control of the load (pressure) to be applied to the workpiece 33.

In addition, the machining device 1 causes the pressing body 11 to move at the second speed until a value of a current flowing through the linear motor 10 is greater than or equal to the current limit value. After the current value is greater than or equal to the current limit value, for example, it is possible to prevent an excessive load from being imposed on the workpiece 33 by stopping the driving of the linear motor 10, reducing a value of the current flowing through the linear motor 10, or causing the movable part to move in a direction away from the workpiece 33. That is, the machining device 1 can improve the accuracy of the control of the load to be applied to the workpiece 33.

In this manner, the machining device 1 can improve the accuracy of the pressing control of the workpiece 33 without measuring the workpiece load.

In addition, when initially pressing the workpiece 33, the machining device 1 detects a distance (difference (FL2POSMAIN1)) necessary when deceleration from the first speed to the second speed is performed, and calculates a new FL mode start position (FL2POSMAIN2) from the position at which the pressing body 11 has come in contact with the workpiece 33 and the difference (FL2POSMAIN1). In addition, the machining device 1 performs an operation of pressing the workpiece 33 against the substrate 31 using the FL mode start position (FL2POSMAIN2) calculated when initially pressing the workpiece 33.

That is, the machining device 1 calculates the FL mode start position based on the position of the workpiece 33 detected when initially pressing the workpiece 33 and the distance necessary until the deceleration from the first speed to the second speed is performed, and presses the workpiece 33 using the calculated FL mode start position. Thereby, the machining device 1 calculates the FL mode start position according to the height of the workpiece 33 and performs control using the calculated FL mode start position. Thereby, the machining device 1 can improve the accuracy of the pressing of the workpiece 33.

In addition, the machining device 1 can directly apply a thrust force, which is applied to the rod 101 (movable part), to the workpiece 33 using the linear motor 10 as a driving device. Thus, the machining device 1 can apply the load (pressure) to the workpiece 33 without causing loss or the like of the thrust force in a mechanical structure as compared to a device having the mechanical structure used to convert a direction of the thrust force. Therefore, the machining device 1 can improve the accuracy of control of the thrust force.

In addition, the machining device 1 calculates a ratio X of the thrust force limit value to the maximum thrust force of the linear motor 10, and corrects an electric angle using a phase angle Y according to the calculated ratio X. By correcting the electric angle and shifting the electric angle capable of generating a maximum thrust force with respect to a magnetic pole position which is a positional relationship between the U, V, and W phase coils 104 and the magnets 103 layered within the rod 101, an apparent thrust force constant is changed to be small.

The thrust force (torque) generated by the linear motor 10 becomes a value "N0×i" obtained by multiplying a thrust force constant N0[N/Arms] by a current i [Arms] flowing through the linear motor 10. The resolution of the thrust force in the linear motor 10 is proportional to the current resolution and the thrust force constant N0 in the power converter 206 or the CT 207. The thrust force constant N0 is a value when the positional relationship between a current flowing through the coil 104 and a magnetic flux of the magnet 103 is consistent. In general, when the linear motor 10 is driven, the control unit 20 applies the current so that the positional relationship between the current flowing through the coil 104 and the magnetic flux of the magnet 103 is consistent. When the phase is shifted by θ, the apparent thrust force constant Nθ is decreased and the thrust force constant Nθ is represented by the following Equation (7).

$$N\theta = N0 \times \cos\theta \quad (7)$$

Figure 23:
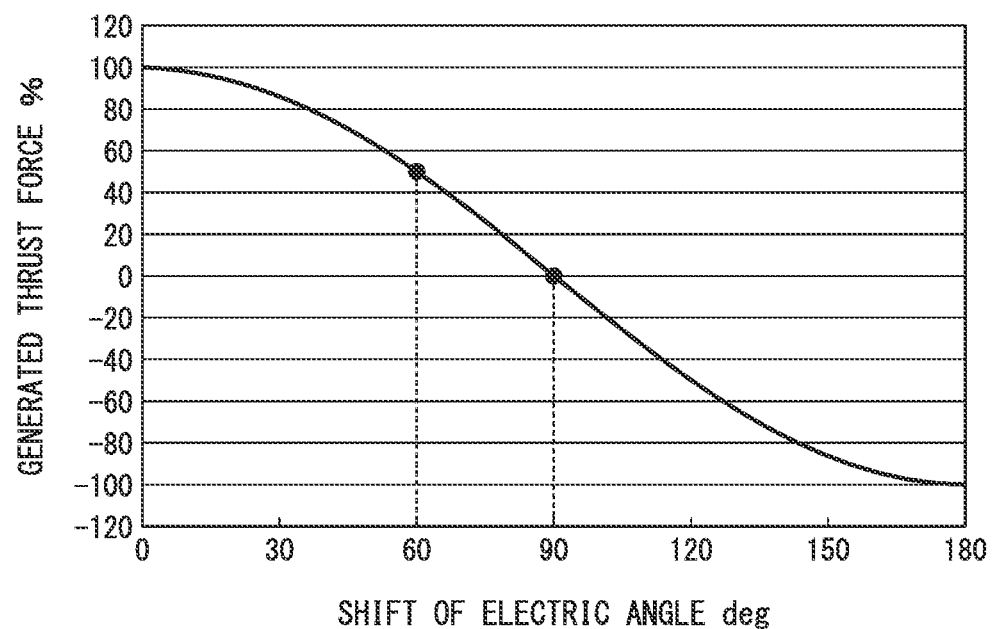
FIG. 23 is a graph showing a relationship between a phase shift of an electric angle and a thrust force generated by the linear motor 10.

FIG. 23 is a graph showing a relationship between a phase shift of an electric angle and a thrust force generated by the linear motor 10.

In FIG. 23, the vertical axis represents the thrust force and the horizontal axis represents a shift amount (angle) of a phase. For example, when the phase is shifted by 60° (θ=60°), the apparent thrust force constant Nθ is half of the thrust force constant N0. In addition, when the phase is shifted by 90° (θ=90°), the apparent thrust force constant Nθ becomes 0.

In the machining device 1, after the pressing body 11 has reached the FL mode start position (FL2POSMAIN2), the apparent thrust force constant Nθ is decreased by carrying a current to the linear motor 10 using the corrected electric angle obtained by correcting the electric angle at the phase angle Y. Thereby, it is possible to reduce the resolution of the thrust force in the machining device 1 and improve the accuracy of the control of the thrust force. In addition, it is possible to prevent an error or variation in a thrust force from being caused from a rounding error or a quantization error and control the thrust force with high accuracy.

In addition, when the speed at which the movable part moves is less than or equal to the second speed, the machining device 1 is configured so that the electric angle correction unit 213 corrects the electric angle. Thereby, the machining device 1 can quickly decrease the movement speed of the movable part to the second speed after the movable part has reached the FL mode start position, and accurately control the thrust force by increasing the resolution of the thrust force when the second speed is reached.

Modified Example

When the pressing control described in the above-described embodiment is performed, it is desirable that pressing start and then instantaneously reach a prescribed pressing force. In order to shorten a response time of the pressing force, it is necessary to increase the speed of the response of the current command. However, a delay may actually be caused according to a response of a control system.

In the control unit 20, there are a control loop which returns from the current control unit 205 to the current control unit 205 via the CT 207, a control loop which returns from the speed control unit 203 to the speed control unit 203 via the magnetic sensor 112, and a control loop which returns from the position control unit 201 to the position control unit 201 via the magnetic sensor 112. A control loop in which the current control unit 205 is designated as the starting point and a control loop in which the speed control unit 203 is designated as the starting point have an influence on a response time of the pressing force. Because a position does not vary when the pressing starts, the influence of the control loop in which the position control unit 201 is designated as the starting point is substantially absent.

In the control loop in which the current control unit 205 is designated as the starting point, control is normally performed at a sufficiently high speed because the loop is small and a difference between the command value of the current and the measured value is substantially absent. Thus, the control loop in which the speed control unit 203 is designated as the starting point has a significant influence on the response time of the pressing force (response performance of the pressing). Therefore, a process of increasing a control gain (proportional gain, integral gain, or the like) used when the current command is calculated in the speed control unit 203 is considered. However, the magnitude of the control gain is limited according to a natural frequency of a mechanism system of the machining device 1 including the linear motor 10. Thus, in order to stably operate the linear motor 10, it is difficult to set the control gain to a fixed value or more.

The case in which the pressing body 11 presses the workpiece 33 is focused. Because the pressing body 11 comes in contact with the workpiece 33, the natural frequency of the mechanism system of the machining device 1 including the linear motor 10 is increased. Therefore, when the pressing is performed, it is possible to increase the control gain as compared to when the pressing body 11 and the rod 101 are moved. Therefore, when the pressing body 11 and the rod 101 are moved and when the pressing body 11 presses the workpiece 33, the control gain in the speed control unit 203 is switched. Thereby, it is possible to perform pressing according to a desired pressing force by shortening the response time of the pressing force.

Hereinafter, an operation in which the switching of the control gain in the speed control unit 203 is applied to the operation of the machining device 1 shown in FIG. 20 will be described. The case in which a movement control gain and a pressing control gain of a value greater than the movement control gain are pre-stored as two control gains in the speed control unit 203 will be described.

Figure 24:
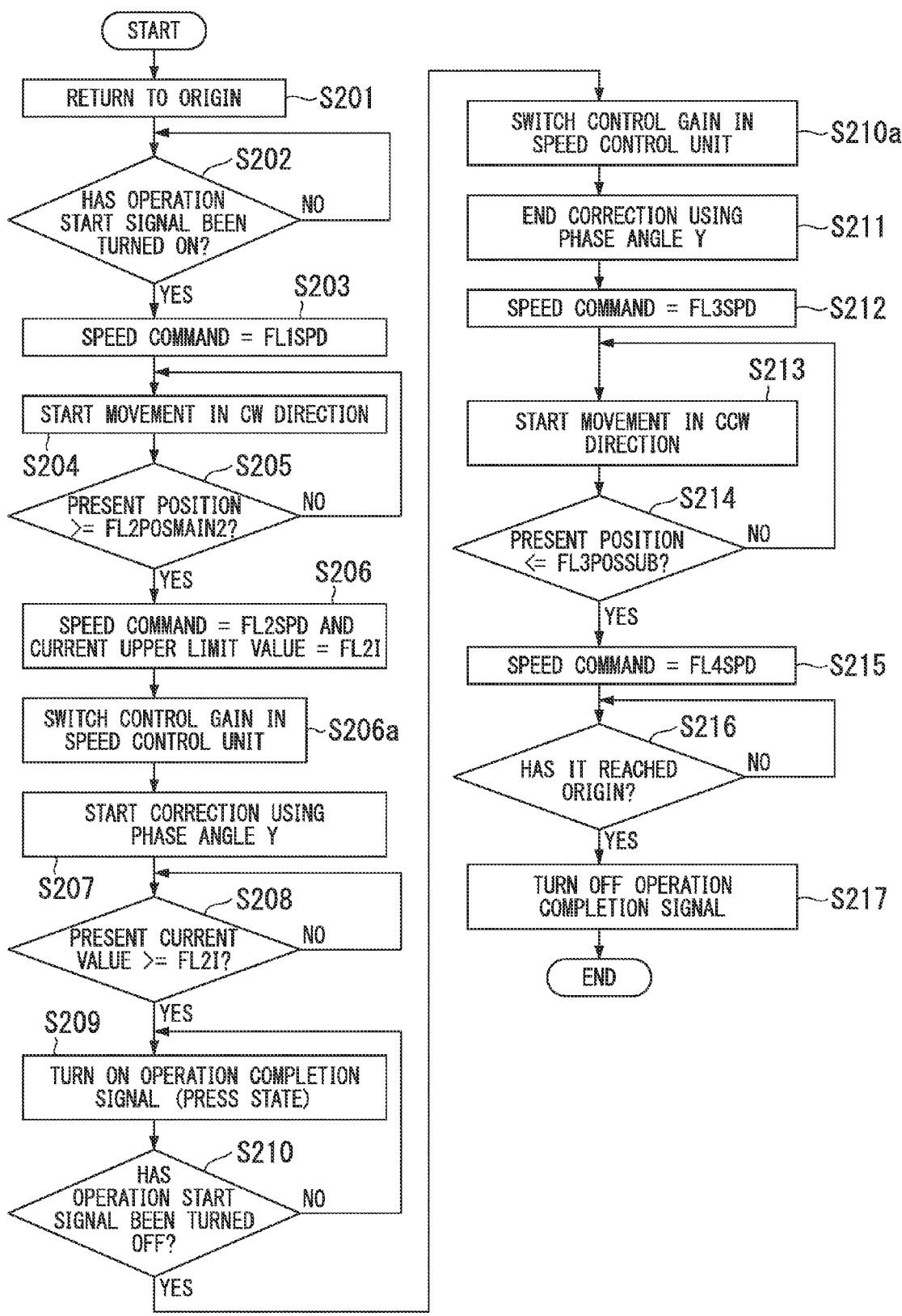
FIG. 24 is a flowchart showing a modified example of an operation in which the machining device 1 in this embodiment presses the workpiece 33 against the substrate 31.

FIG. 24 is a flowchart showing a modified example of the operation in which the machining device 1 in this embodiment presses the workpiece 33 against the substrate 31.

The flowchart shown in FIG. 24 is different from the flowchart shown in FIG. 20 in the following two points. That is, a process in which the speed control unit 203 switches the control gain from the movement control gain to the pressing control gain (step S206a) is applied between steps S206 and S207 and a process in which the speed control unit 203 switches the control gain from the pressing control gain to the movement control gain (step S210a) is applied between steps S210 and S211. Because the process in each of the other steps (steps S201 to S217) is the same as that of the flowchart of FIG. 20, a description thereof is omitted here.

The speed control unit 203 performs the process of steps S206a and S210a based on a determination result of the position determination unit 211.

Although the case in which the switching of the control gain from the movement control gain to the pressing control gain is performed between step S206 and step S207 is shown in FIG. 24, the present invention is not limited thereto. Until the pressing body 11 comes in contact with the workpiece 33 after the position of the pressing body 11 has reached the FL mode start position (after step S205), it is only necessary to perform switching from the movement control gain to the pressing control gain.

In addition, it is only necessary to switch the control gain from the pressing control gain to the movement control gain before the movement toward the origin (in the CCW direction) at the third speed (FL3SPD) (before step S213). In addition, the speed control unit 203 may be configured to switch the control gain at a timing at which the deceleration from the first speed to the second speed has started.

As described above, by switching the control gain of the speed control unit 203, it is possible to define the control gain (pressing control gain) without being limited by the natural frequency of the mechanism system when the pressing body 11 and the rod 101 are moved toward the workpiece 33 and when the pressing body 11 and the rod 101 are moved toward the origin. Thus, it is possible to improve the responsiveness of the pressing force and shorten a time until the pressing body 11 presses the workpiece 33 by a desired pressing force after the pressing body 11 comes in contact with the workpiece 33.

The switching of the control gain in the speed control unit 203 as shown in FIG. 24 may be configured to be applied to an operation of the machining device 1 shown in FIG. 19.

Although the case in which the control unit 20 controls the rod type linear motor 10 has been described in the above-described embodiment and its modified example, the present invention is not limited thereto. The control unit 20 may be configured to control a flat type linear motor or rotary motor. When the control unit 20 controls the rotary motor, rotary motion may be converted into linear motion using a ball screw or the like.

The process of steps S109 and S110 in FIG. 19 may be performed in advance, and the phase angle Y may be pre-stored in the electric angle correction unit 213.

Although the case in which the workpiece 33 is pressed by the pressing body 11 mounted on the tip of the rod 101 of the linear motor 10 has been described in the above-described embodiment, the workpiece 33 may be configured to be pressed on the tip of the rod 101.

The above-described control unit 20 may internally include a computer system. In this case, the steps of each of the above-described processes to be performed by the position control unit 201, the switch unit 202, the speed control unit 203, the switch unit 204, the current control unit 205, the power converter 206, the CT 207, the speed calculation unit 208, the position calculation unit 209, the speed switching position determination unit 210, the position determination unit 211, the completion signal generation unit 212, and the electric angle correction unit 213 are stored in a program format on a computer-readable recording medium. Therefore, the processes of the functional units are executed by causing a computer to read and execute the program. The computer-readable recording medium refers to a magnetic disk, a magneto-optical disc, a compact disc-read only memory (CD-ROM), a digital versatile disc (DVD)-ROM, a semiconductor memory, or the like. The computer program may be configured to be distributed to a computer via a communication circuit and executed by the computer receiving the distribution.

REFERENCE SIGNS LIST

1 Machining device (linear motor device)
10 Linear motor
20 Control unit
33 Workpiece (pressurizing object)
101 Rotor (movable part)
210 Speed switching position determination unit
211 Position determination unit (movement control unit)
213 Electric angle correction unit

The invention claimed is:

1. A linear motor device comprising:
a linear motor, and
a control unit configured to apply a pressure to a pressurizing object by causing a movable part of the linear motor to move,
wherein, the control unit, after causing the movable part to move toward the pressurizing object at a predetermined first speed based on position control, controls the movable part to move by performing deceleration to a second speed which is slower than the first speed and at which the pressure applied to the pressurizing object is less than or equal to a predetermined pressure when the movable part starts to apply the pressure to the pressurizing object,
the control unit causes the movable part to move at the second speed until a current flowing through the linear motor is greater than or equal to a predetermined current limit value, and
wherein the control unit comprises:
a speed switching position determination unit configured to calculate a deceleration start position which is a position at which a speed at which the movable part moves starts to decrease from the first speed to the second speed based on a distance required when the speed at which the movable part moves decreases from the first speed to the second speed and a position at which the pressure starts to be applied to the pressurizing object; and
a movement control unit configured to cause the movable part of the linear motor to move at the first speed when causing the movable part to move from a predetermined position to the pressurizing object, and to cause the movable part to move at the second speed until the current flowing through the linear motor is greater than or equal to the current limit value when the movable part reaches the deceleration start position.

2. The linear motor device according to claim 1,
wherein the control unit further comprises an electric angle correction unit configured to correct an electric angle corresponding to a magnetic pole position of the movable part based on a ratio of a load applied to the pressurizing object to a maximum thrust force of the linear motor, and
wherein the control unit causes the movable part to move based on the electric angle corrected by the electric angle correction unit.

3. The linear motor device according to claim 1, wherein, the control unit, after starting the deceleration from the first speed to the second speed, switches a control gain to that of a value which is greater than a control gain used when causing the movable part to move at the first speed.

4. A linear motor device, comprising:
a linear motor, and
a control unit configured to apply a pressure to a pressurizing object by causing a movable part of the linear motor to move,
wherein, the control unit, after causing the movable part to move toward the pressurizing object at a predetermined first speed based on position control, controls the movable part to move by performing deceleration to a second speed which is slower than the first speed and at which the pressure applied to the pressurizing object is less than or equal to a predetermined pressure when the movable part starts to apply the pressure to the pressurizing object,
the control unit causes the movable part to move at the second speed until a current flowing through the linear motor is greater than or equal to a predetermined current limit value,
wherein the control unit further comprises an electric angle correction unit configured to correct an electric angle corresponding to a magnetic pole position of the movable part based on a ratio of a load applied to the pressurizing object to a maximum thrust force of the linear motor, and
wherein the control unit causes the movable part to move based on the electric angle corrected by the electric angle correction unit.

5. The linear motor device according to claim 4, wherein the electric angle correction unit corrects the electric angle when the speed at which the movable part moves is less than or equal to the second speed.

6. The linear motor device according to claim 5, wherein, the control unit, after starting the deceleration from the first speed to the second speed, switches a control gain to that of a value which is greater than a control gain used when causing the movable part to move at the first speed.

7. The linear motor device according to claim 4, wherein, the control unit, after starting the deceleration from the first speed to the second speed, switches a control gain to that of a value which is greater than a control gain used when causing the movable part to move at the first speed.

8. A linear motor comprising:
a linear motor, and
a control unit configured to apply a pressure to a pressurizing object by causing a movable part of the linear motor to move,
wherein, the control unit, after causing the movable part to move toward the pressurizing object at a predetermined first speed based on position control, controls the movable part to move by performing deceleration to a second speed which is slower than the first speed and at which the pressure applied to the pressurizing object is less than or equal to a predetermined pressure when the movable part starts to apply the pressure to the pressurizing object,
the control unit causes the movable part to move at the second speed until a current flowing through the linear motor is greater than or equal to a predetermined current limit value,
wherein, the control unit, after starting the deceleration from the first speed to the second speed, switches a control gain to that of a value which is greater than a control gain used when causing the movable part to move at the first speed.

9. A method for controlling a linear motor device comprising a linear motor and a control unit configured to apply a pressure to a pressurizing object by causing a movable part of the linear motor to move, the method comprising:
controlling, after causing the movable part to move toward the pressurizing object at a predetermined first speed based on position control, the movable part to move by performing deceleration to a second speed which is slower than the first speed and at which the pressure applied to the pressurizing object is less than or equal to a predetermined pressure when the movable part starts to apply the pressure to the pressurizing object; and
causing the movable part to move at the second speed until a current flowing through the linear motor is greater than or equal to a predetermined current limit value, wherein after starting the deceleration from the first speed to the second speed, switching a control gain to that of a value which is greater than a control gain used when causing the movable part to move at the first speed.

* * * * *